(12) United States Patent
Yates et al.

(10) Patent No.: US 6,372,113 B2
(45) Date of Patent: *Apr. 16, 2002

(54) COPPER FOIL AND COPPER CLAD LAMINATES FOR FABRICATION OF MULTI-LAYER PRINTED CIRCUIT BOARDS AND PROCESS FOR PRODUCING SAME

(75) Inventors: Charles B. Yates, Princeton; George Gaskill, Manahawkin, both of NJ (US); Chinsai T. Cheng, Orange, CT (US); Ajesh Shah, West Windsor, NJ (US); Adam M. Wolski, Edgewater, NJ (US); Paul DuFresne, Langhorne, PA (US)

(73) Assignee: Yates Foil USA, Inc., Bordentown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/394,675

(22) Filed: Sep. 13, 1999

(51) Int. Cl.[7] .............................. C25D 3/38; C25D 7/06; B32B 15/20; B32B 3/30
(52) U.S. Cl. .................. 205/111; 205/296; 205/297; 428/607; 428/612; 428/675; 428/687; 428/935
(58) Field of Search ................................ 428/606, 607, 428/600, 612, 626, 637, 675, 687, 935; 205/111, 77, 296, 297, 298

(56) References Cited

U.S. PATENT DOCUMENTS

| | | | |
|---|---|---|---|
| 3,857,681 A | 12/1974 | Yates et al. | 29/195 |
| 3,918,926 A | 11/1975 | Wolski et al. | 29/195 |
| 3,998,601 A | 12/1976 | Yates et al. | 29/195 |
| 5,207,889 A | * 5/1993 | Wolski et al. | 205/155 |
| 5,437,914 A | 8/1995 | Saida et al. | 428/209 |
| 5,447,619 A | 9/1995 | Wolski et al. | 205/50 |
| 5,545,466 A | 8/1996 | Saida et al. | 428/209 |
| 5,679,230 A | * 10/1997 | Fatcheric et al. | 205/50 |
| 5,779,870 A | 7/1998 | Seip | 205/77 |
| 5,792,333 A | * 8/1998 | Oguro et al. | 205/103 |
| 5,858,517 A | * 1/1999 | Tagusari et al. | 428/209 |
| 5,863,410 A | 1/1999 | Yates et al. | 205/585 |
| 5,989,727 A | * 11/1999 | Yates et al. | 428/607 |
| 6,042,711 A | * 3/2000 | Sadey et al. | 428/607 |

FOREIGN PATENT DOCUMENTS

WO    WO 99/16935    4/1999

* cited by examiner

Primary Examiner—John J. Zimmerman
(74) Attorney, Agent, or Firm—Finnegan, Henderson, Farabow, Garrett & Dunner, L.L.P.

(57) ABSTRACT

Treated copper foil produced by electrodepositing on a matte surface of a base copper foil a "corrective" copper layer having a surface roughness different from the surface roughness of the matte surface of the base foil and which has a peak count greater than the peak count of the matte surface of the base foil. In the electrodeposition there are used a unique electrolyte composition and plating conditions effective to control the micro-throwing process of the plating process so that the surface roughness of the corrective is substantially constant from one batch of base foil to another.

6 Claims, 6 Drawing Sheets

THREE 1-OUNCE COPPER FOILS WITH
DIFFERENT MATTE SIDE MICROTOPOGRAPHY

THREE 1-OUNCE COPPER FOILS WITH
CORRECTED MATTE SIDE MICROTOPOGRAPHY

COPPER FOIL AND COPPER CLAD LAMINATES FOR FABRICATION OF MULTI-LAYER PRINTED CIRCUIT BOARDS AND PROCESS FOR PRODUCING SAME

FIELD OF THE INVENTION

This invention relates to electrolytic copper foil useful in the fabrication of printed circuit boards (PCBs), especially multi-layer printed circuit boards (MLBs), to a process for producing such foil, and to copper-clad laminates made with such foil. More particularly, this invention relates to such foil having an electrodeposited copper corrective/bond-enhancing layer applied to a matte surface of the foil.

BACKGROUND

Like many other materials used in high technology applications, electrodeposited copperfoil is a composite, i.e., it has a near-surface region with properties differing from those of the bulk material. In this sense of the word, the bulk of copper foil (core) serves in PCBs as a conductor of electricity. One of the outer surfaces of the foil serves as a substrate for image patterning and soldering to ensure necessary electrical connection between components, while the opposite side of the foil is responsible for permanently bonding conductor lines to the polymeric substrates. In addition, in the case of copper foil destined for fabrication of MLBs, the same side of the foil that is used for image patterning, serves also as a substrate for application of brown oxide treatment that is necessary for B-stage lamination.

A conventional process for making electrolytic copper foil consists essentially of two steps: first, electrodeposition or plating of a "base" foil on a rotating drum-cathode and second, passing the foil through a "treater" machine in order to provide one of the outer surfaces of the "base" or "raw" foil with a bonding treatment suitable for bonding to a polymeric substrate. The raw foil is pale pink in color and has two distinctly different looking sides—a "shiny side", the side which was plated onto the drum surface and then stripped is quite smooth while the other side, the side which was facing toward the electrolyte and the anodes, is referred to as the "matte" side since it has a velvety finish, due to the difference in the growth rate of differing crystal faces during electrodeposition of the "base" foil. The matte side surface, at this stage has a very fine scale micro-roughness and a very specific micro-topography. Viewed under high magnification of a scanning electron microscope, it is composed of peaks and valleys. The peaks are closely packed cones or pyramids. The cones' height, slant, packing and shape depend, as is well known, upon closely controlled independent variables of foil thickness, current density, solution composition and temperature and the type and concentration of the addition agents and the like.

A choice exists as to whether the shiny side or the matte side of the foil should be provided with the bonding treatment. Each choice has its advantages and disadvantages. Moreover, it will depend on which segment of the PCB industry the foil is destined for: printed circuit boards that are manufactured with rigid, single sided or double sided copper clad laminates or multilayer boards. Both require high quality copper foil, but while PCB manufacturers who use rigid copper clad laminates use copper foil with bonding treatment applied to the matte side of the foil, the MLBs segment of the PCB industry might prefer copper clad laminates with bonding treatment applied to the shiny side of the foil, since in this case matte side of the foil forms the outer surface of the laminate, and the "natural" micro-roughness of the matte side contributes, as will be explained, toward quality and reliability of finished MLB.

While both rigid boards and MLB circuits these days conform to the needs of miniaturization and are manufactured with copper foil conductor or track lines that are as narrow as 5 mils, or less, it is MLBs that are the fastest growing segment of the industry, since they permit achieving the highest functional density in electronic packaging. The considerations that govern the choice whether bonding treatment should be applied to the matte side of the foil (in which shiny side of the foil forms the outer surface of the laminate), or the shiny side of the foil (in which case matte side of the foil forms the outer surface of the laminate) depend on the fundamental roles the two outer surfaces of copper foil play in the fabrication of PCBs.

The side of the foil which is provided with the bonding treatment should assure the highest possible bond strength of copper foil-polymeric substrate interface. Conversely, the opposite side of the foil which forms the top surface of copper clad laminate should assure good adhesion between this surface and photo-resist. These two requirements should be balanced against each other, with the view of achieving the optimum functional quality and performance of PCB.

The basic raw material for manufacturing printed circuits is a laminate clad with copper foil, i.e., thin copper foil firmly bonded to a substrate, e.g., a polymeric, dielectric (insulating) base material. This "bonding" operation is accomplished in laminating plants and involves heating and cooling cycles. Sheets of copper foil are laid on sheets of "prepreg" (e.g., glass fabric impregnated with epoxy resin). Both materials are placed in a hydraulic press with heated pressing plates and pressed together under high pressure. At elevated temperatures, the resin liquefies and is forced, by pressure, into micro-irregularities of the foil surface. This is followed by a second cycle where both materials are cooled while pressure is maintained. The resin solidifies in the irregularities of the foil surface to firmly bond materials together, making them very difficult to pull apart.

The "peel strength" between both materials, i.e., a mechanical force required to separate two bonded materials, is increased if the bonding side of the copper foil is provided with a bonding treatment. Such bonding treatment technology and processes developed by major copper foil manufacturers are well known.

High peel strength is an extremely important characteristic since the mechanical support of circuit elements, as well as the current carrying capability of PCBs, is provided by the copper foil/polymer joint. It is essential that the foil is bonded very tightly and securely to the substrate so that the adhesive joint can withstand all PCB manufacturing steps and remain constant throughout its service life—without a decrease in initial adhesion strength.

Traditionally, in rigid, single sided or double sided copper clad laminates the "shiny" side (drum side) of the foil represents the metallic side of copper clad laminate, while the matte side (electrolyte side), responsible for permanently bonding conductor lines to the polymeric substrates. Since the highest possible bond strength (peel strength) was the most important desideratum in rigid boards technology, it was logical to combine the original micro-roughness of the matte side of the foil with the further micro-roughening effect of the electrodeposited bonding treatment.

In the case of multilayer printed circuit boards, the considerations of bondability are more complex. In the fabrication of MLBs, copper foil is laminated (bonded) to polymeric substrates twice. First, thin, double-sided copper clad laminates are produced. These laminates are then subjected to image patterning and etching away of unwanted copper to produce the desired patterns of circuitry. Several layers of double-sided boards prepared in such a manner are stacked together, with sheets of prepreg (glass reinforced polymeric resin composites) inserted between in order to dielectrically separate adjacent boards form one another. Such a stack of circuit boards and prepreg is then laminated together, in the so-called "B-stage lamination", to form a monolithic multi-layer board. Later, holes are punched or drilled through the board in prearranged placed and so-called thru-hole plating of copper is used to ensure the electrical interconnection between all layers of copper-track conductor lines. Obviously, both outer surfaces of copper foil are subjected to bonding in the fabrication of MLBs and the bond strength of both surfaces is equally important.

Bonding treatment on one side of the copper foil assures bondability in the first (primary) lamination, but the top surfaces of copper circuitry have to be rendered "bondable" before B-stage lamination, since otherwise, the bond between copper track lines and the prepreg is not sufficient to withstand thermal shock of reflow soldering, and de-lamination takes place.

To render top surfaces of copper circuit lines adhesion prone, it is practice in the fabrication of MLBs to subject the inner layer boards, with their patterns of circuitry, to a so-called brown-oxide treatment, which changes the micro-opography of the top surfaces of the track lines to improve their bondability to the polymeric pre-preg. This brown oxide treatment is typically produced by immersing the boards in an alkaline solution of sodium chlorite, which by its oxidizing action causes the conversion of metallic copper on top surfaces of exposed copper tracks into cupric oxide CuO with a possible admixture of cuprous oxide $Cu_2O$, depending on the type of the bath and operation conditions.

This oxide coating grows in the form of dendritic crystals, perpendicular to the surface of the copper tracks. Thus, the surface area available for bonding to polymeric substrates is increased and improved "bondability" is achieved.

As we have said earlier, this side of the copper foil which forms the top surface of copper-clad laminate is subjected to image patterning that involves the use of light sensitive materials, so-called photo-resist. The roll of a bonding treatment is to firmly anchor track lines to the polymeric substrate. After the foil is bonded to the substrate, the other side of the foil, which forms the outer surface of copper-clad laminate, is used for image patterning.

It is the practice in manufacturing printed circuit boards from copper-clad laminates to form an image of the desired printed circuit pattern on the exposed copper surface of a laminate by a photographic technique which leaves the desired pattern formed of a photo-resist material on the surface of the copper.

It will be appreciated that for the photographic imaging to be sharp and precise, the photo-resist has to spread well on the foil's surface and adhere well to this surface.

It is a practice in manufacturing PCBs to roughen the exposed surface of the copper to achieve good resist adhesion. This roughening also removes tenacious stainproof films which foil manufacturers apply to the foil to protect it from oxidation and staining before it reaches the user. Photo-resist does not adhere to the stainproof films, which therefore have to be removed. Thus, roughening of the foil surface serves the purpose of removal of stainproof film, as well as changing the copper surface topography from smooth to micro-rough, to facilitate photo-resist adhesion which is a condition of good definition of track lines.

This roughening is performed by either mechanical means, e.g., abrasion by brushes, scrubbing with pumice, or chemical means (so-called micro-etching), which is accomplished by subjecting the copper surface of copper-clad laminates to the etching action of oxidizing mineral acids. Such acids attack the smooth surface of the foil along the copper grain boundaries, thus creating pits and pores and changing the copper surface from smooth to micro-rough.

Naturally, it is tempting to utilize the "natural" micro-roughness of the matte side of the raw foil to encourage good adhesion of photo-resist, without resorting to micro-etching or scrubbing which are costly and troublesome steps. The use of the matte side of the foil for image patterning can be accomplished by the simple expedient of providing the shiny side of the foil with the bonding treatment, and preparing copper-clad laminates in which the shiny side of the foil, with a bonding treatment electro-deposited over it, is bonded to the polymeric substrate, so that the matte side of the foil represents the top surface of the clad laminate and serves as a substrate for image patterning. In addition, such concept offers an improved quality of brown oxide treatment prior to B-stage lamination in the fabrication of MLBs.

The oxide treatment techniques used in the fabrication of MLBs are troublesome, expensive, and create their own technical problems. One, the so-called "pink ring" is a result in the chemical attack on copper oxide layers by the chemicals used in through-hole plating. It is customary now to engage in additional steps of brown-oxide treatment, which is a reduction of cupric oxide treatment to the metallic copper, since the bonding treatment composed of copper is immune to pink ring, as opposed to CuO which is easily dissolved in mineral acids. This reduction step further complicates brown oxide processes and renders them even more expensive.

It has been proposed that a special copper foil provided with the bonding treatment on the shiny side of the foil is better suited to fabrication of MLBs. If the bonding treatment is plated onto the drum side of the foil this results in a lower peel strength, e.g., perhaps about 8 lbs./inch than when the same treatment is plated onto the matte side of the foil, e.g., about 12 lbs./inch. Nevertheless, such peel strength is more than adequate in MLBs.

With respect to copper foil destined for use in producing MLBs, we have found that the brown oxide "treatment" which is presently applied to the shiny side of the foil and provides a quite low peel strength can advantageously by applied to the matte side of base foil, which by itself, due to its peaks and valleys topography and the resulting micro-roughness, has a considerable peel strength of about 4 lbs./inch, as opposed to the shiny side of the foil, which has substantially no peel strength at all. When this is done, very little brown oxide has to be applied to the matte side of the foil to bring the peel strength to the desired level of, e.g., 7 lbs./inch or so. This reduced amount of brown oxide is much less fragile in terms of structure, than the higher amount of brown oxide that has to be applied to the shiny side of the foil, to achieve the same peel strength. The need for reduction of cupric oxide to metallic copper can thus be eliminated, and the entire process becomes simpler and less expensive, while the quality of MLBs (particularly the dielectric properties and the resistance to delamination due to the solder shock) are improved.

Obviously, copper foil with the bonding treatment to the shiny (drum) side offers advantages in the fabrication of MLBs. That type of foil, often referred to as reverse side treated foil or drum side treated foil, is accepted in PCB industry and is a subject of several patents. These include:

U.S. Pat. No. 5,437,914 to Saida et al.
U.S. Pat. No. 5,447,619 to Wolski et al.
U.S. Pat. No. 5,545,466 to Saida et al.
U.S. Pat. No. 5,779,870 to Seip What the improvements in printed circuits technology described in these patents do not take into account, is the lack of uniformity of the foil's matte side surface characteristics.

Surface quality (profile) of the base foil's matte side determines its suitability as a cladding for laminate applications destined for fine line circuitry and multi-layer printed circuit boards. The criteria of suitability depend on the quantitative evaluation of the matte side's surface roughness. A characteristic that gives useful information about the surface is called Rz, which is the average deviation from the mean line of the five highest peaks and the five lowest valleys within the roughness sampling length. The base foil's matte side provides the basic shape of the foil surface for embedding a substrate in the resin to promote adhesion in copper clad laminates used in manufacturing PCBs.

The surface characteristics of the matte side of the foil are, by large, the side effect of the parameters of the process employed in the fabrication of the base foil. The primary objective of the fabrication process is to satisfy the desires of the printed circuit industry by imparting a combination of physical, metallurgical, and electrical properties to the bulk of the foil. These properties are determined by the microstructure, which in turn is determined by conditions of the plating process. Typical properties of the core of the foil sought by PCB manufacturers are suitable tensile strength, yield strength, elongation, ductility, and resistance to fatigue. Many of the desired properties relate to the maximum load the material may withstand before failure, and are usually derived from stress-strain curves. Similarly, electrical conductivity is considered an important property of copper foil. All these properties of copper foil depend on the foil's microstructure, but particularly on the microstructure of the core of the foil. This microstructure, responsible for foil's properties, is in turn determined by electrodeposition conditions.

As a result of the fact that the main objective of the fabrication of the base foil or "raw foil" is to impart of the body or "core" of the foil, the desired physical (metallurgical) characteristics desired by printed circuit industry, the surface characteristics of the matte side of the foil (Rz, peak count) etc., vary widely from one to another manufacturer of copper foil, from one production lot to another, and from one gauge of the foil to another. We have found that this fact makes the matte side of the foil a much less dependable outer surface in copper clad laminates destined for fabrication of MLB's.

The matte side surface represents a substrate that is responsible for photo resist adhesion and therefore precision of image patterning, optical properties of the surface responsible for high resolution and definition of circuitry, and for the anchoring of the brown oxide treatment that assures adhesion integrity of MLB's after B stage lamination.

In that respect, copper clad laminates having the shiny side up offer at least a constancy of the surface characteristics, even if that surface requires micro-etching, or mechanical micro-roughening.

The matte side up concept, while offering a desirable micro-rough surface for subsequent processing, fails to offer constancy of the surface characteristics of the matte side, which characteristics are crucial for the actual optimizing of the fabrication stages of today's MLB's.

It is a general object of the present invention to provide a method of controlling the surface characteristics of the matte side of copper foil to make it more suitable for the high resolution image patterning, necessary in the fabrication of multilayer printed A primary object of the present invention is to overcome the drawbacks of prior art foils by providing a copper foil having a constancy, from one foil to another, of matte side surface characteristics enabling improved photoresist adhesion. Another object of the invention is such a foil having a matte side with an improved peel strength compared to that of raw foil. A further object of the invention is a copper-clad laminate made with such foil, which laminate is especially suitable for use in the manufacture of MLB's. An additional object of the invention is a process that can render the matte side of foils with different matte side microtopographies substantially alike and thus offer manufacturers of MLB a foil, which is provided with a traditional bonding treatment on the shiny side to be laminated to a polymeric substrate, and which offers a "corrected"matte side as a substrate for subsequent MLB's processing.

SUMMARY OF THE INVENTION

The above objects of the present invention may be achieved by an electrodeposited copper foil which comprises an electrodeposited copper base foil having a drum side with a shiny surface and an electrolyte side with a matte surface formed of micro-peaks and micro-valleys; and a copper microrough layer electrodeposited on the matte surface of the base foil, the microrough layer surface having (i) a roughness RZ different from the roughness Rz of the matte surface of the base foil and, (ii) a peak count greater than the peak count of the matte surface of the base foil.

The above copper foil can be produced by a process which comprises (a) electrodepositing a copper foil on a rotating drum cathode to produce a base copper foil having a shiny drum side and an electrolyte side with a matte surface; and (b) electrodepositing on the matte surface of the foil a copper microrough layer under electrodeposition conditions effective to electrodeposit a copper microrough layer having a surface roughness less than the roughness of matte surface and, preferably, a peak count greater than the peak count of the matte surface.

The present invention also provides a copper-clad laminate wherein the above copper foil in bonded to a polymeric substitute through a bond-enhancing copper layer electrodeposited on the drum side of the base foil.

BRIEF DESCRIPTION OF THE DRAWINGS

The present invention will be described with reference to the accompanying drawings, wherein.

DESCRIPTION OF PREFERRED EMBODIMENTS

Figure 1:
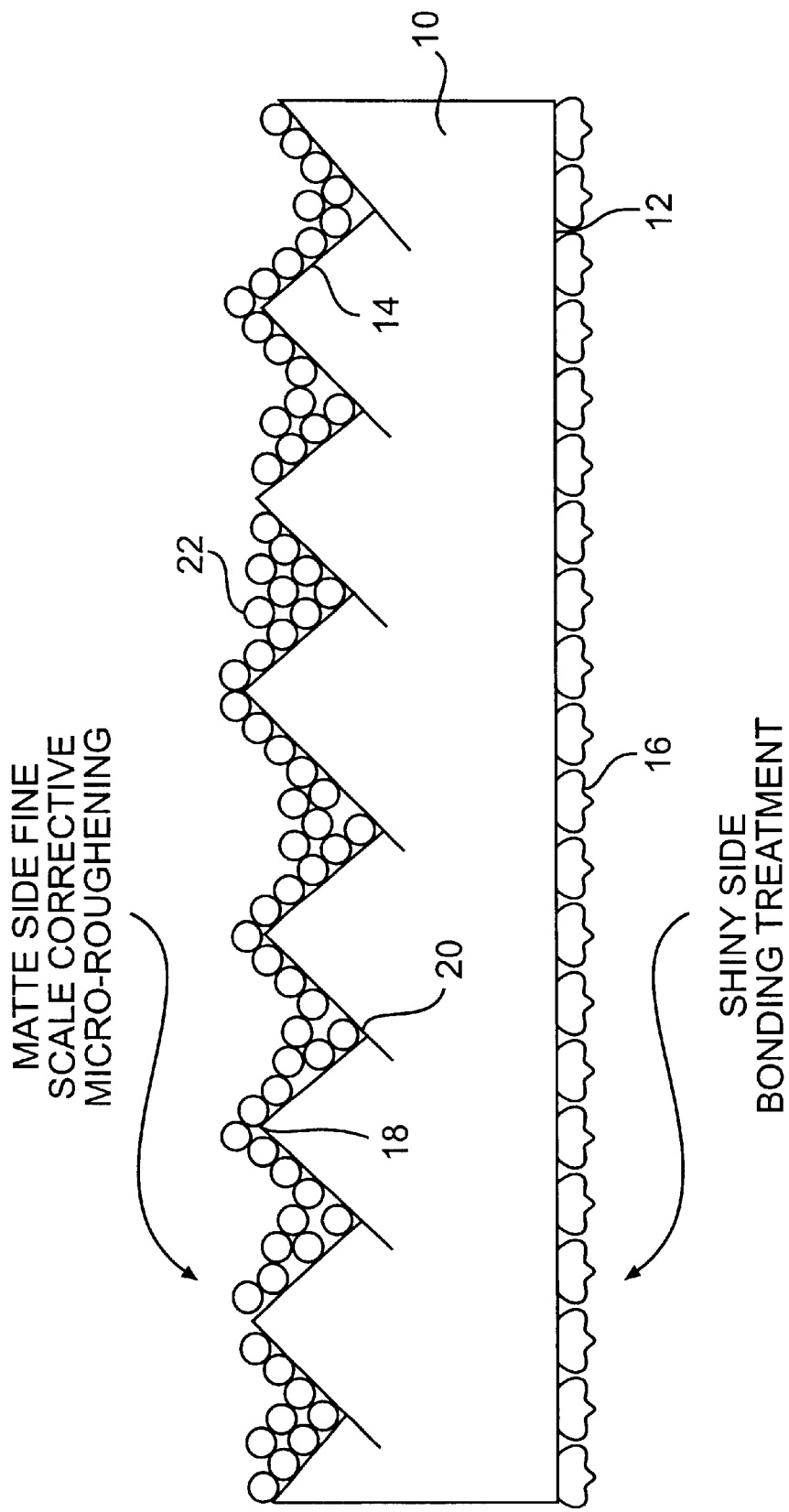
FIGS. 1A illustrates a side view of a embodiment of copper foil treatment in accordance with the present invention.

FIG. 1 illustrates a preferred embodiment of a treated foil in accordance with the present invention, wherein a copper base foil 10 has been electrodeposited on a rotating drum cathode using a well-known method which need not be described in detail herein. The base foil 10 has a shiny drum side 12 and an electrolyte side (matte side) 14 having a matte surface formed micro-peaks 18 and micro-valleys 20 and having a following table wherein there is shown the surface characteristics of the matte sides of each of raw foil Samples 1, 2, and 3, and the surfaces of the resulting treated foils, samples 1A, 2A and 3A.

Figure 4A:
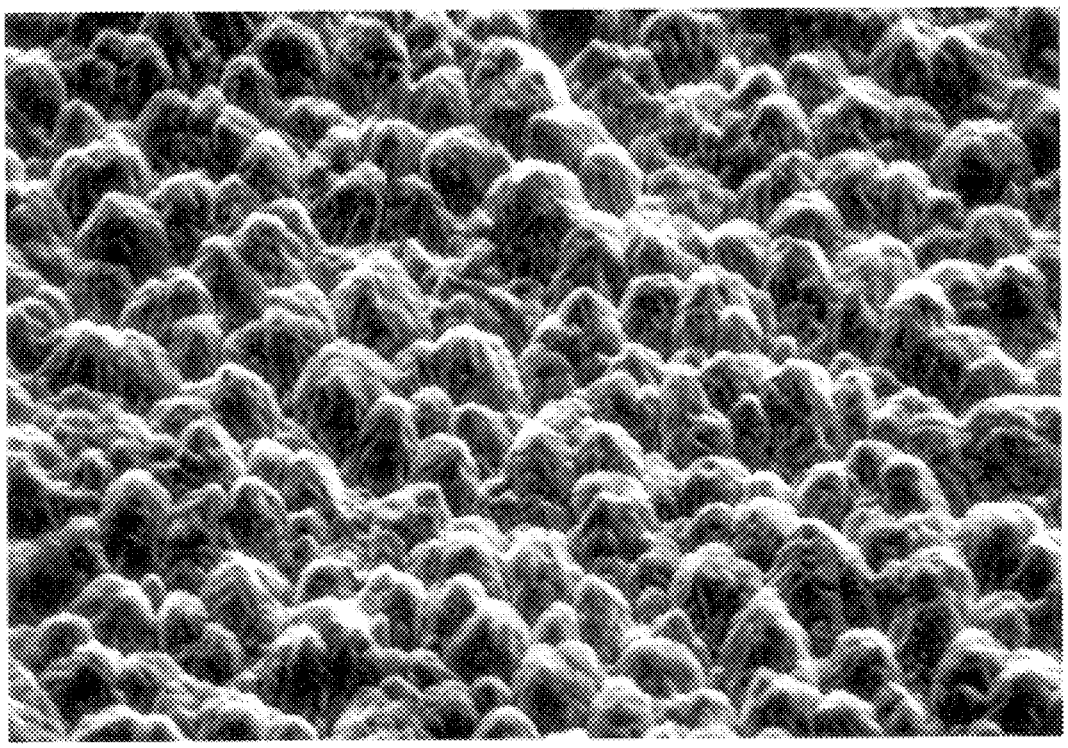
FIGS. 4A–4C are photomicrographs (1000x) of the matte side surface of different copper foils.
Figure 5A:
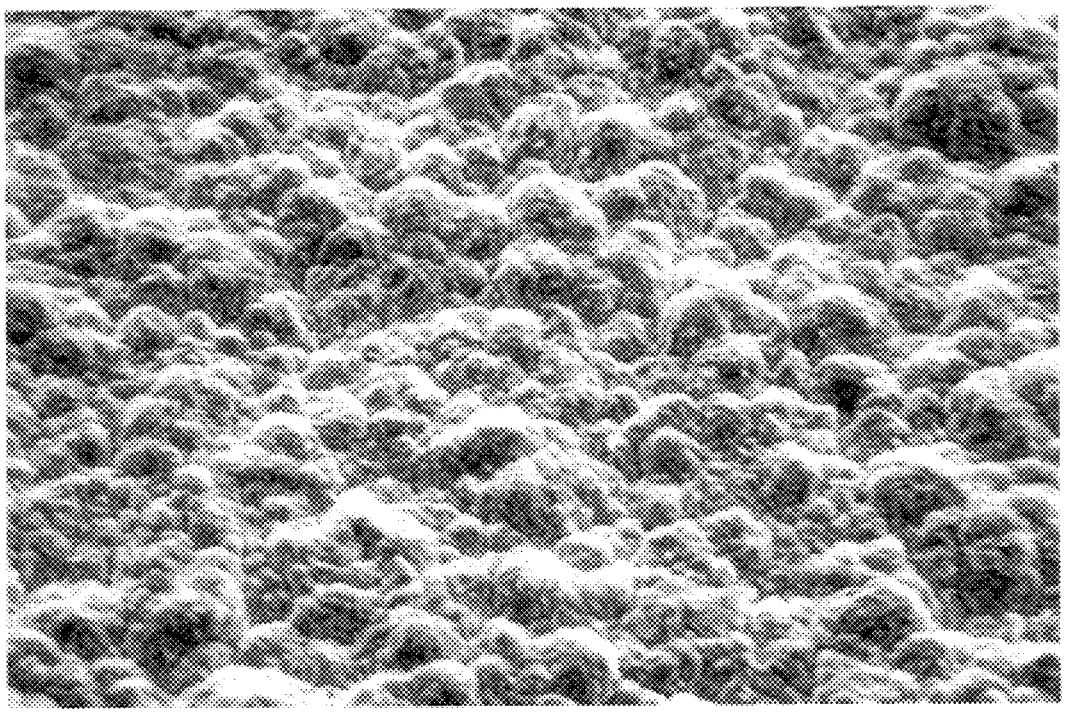
FIGS. 5A–5C are photomicrographs (1000x) of the matte side surface of the above foils after deposition of a corrective copper layer in accordance with the invention.
Figure 4B:
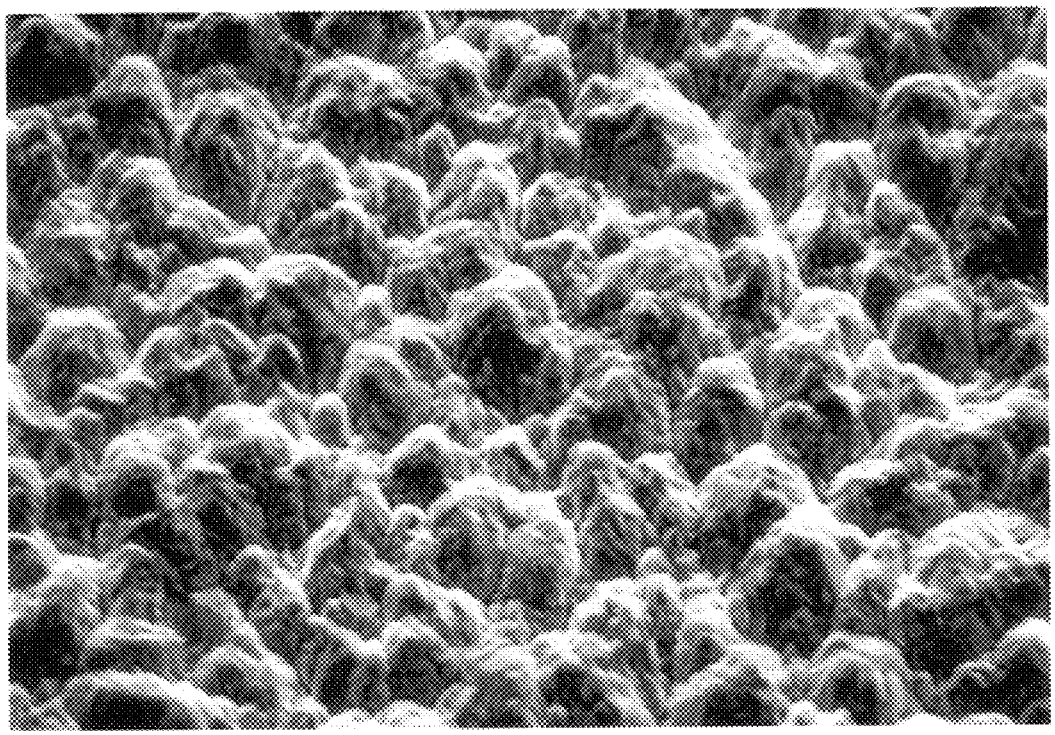
Figure 5B:
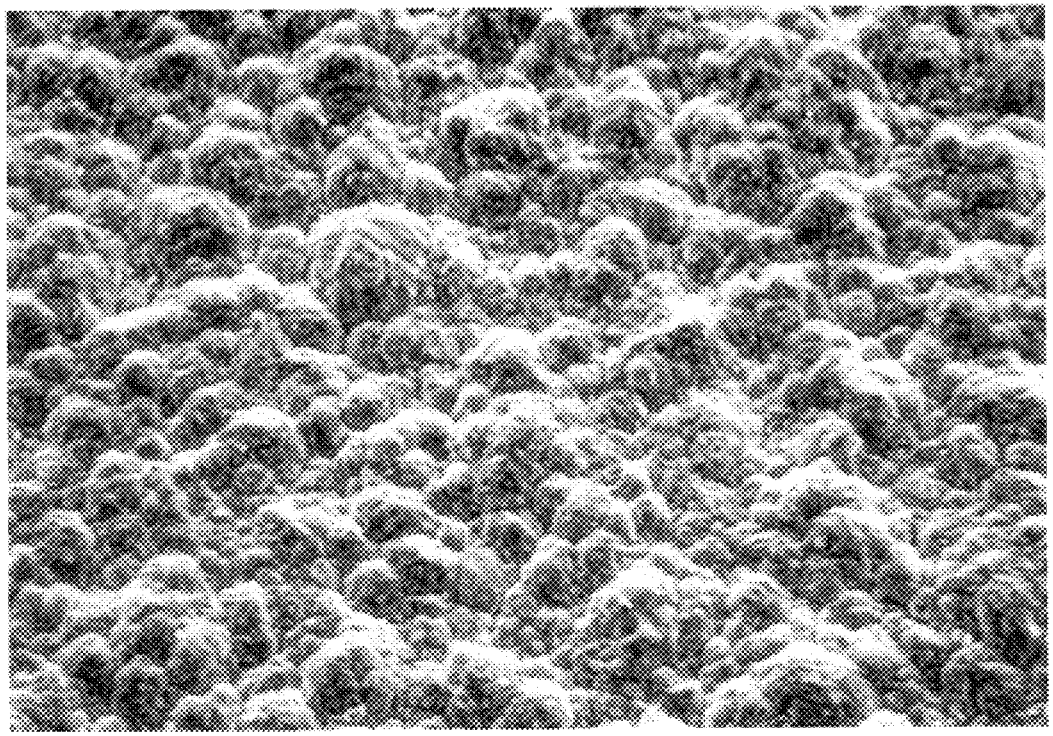
Figure 4C:
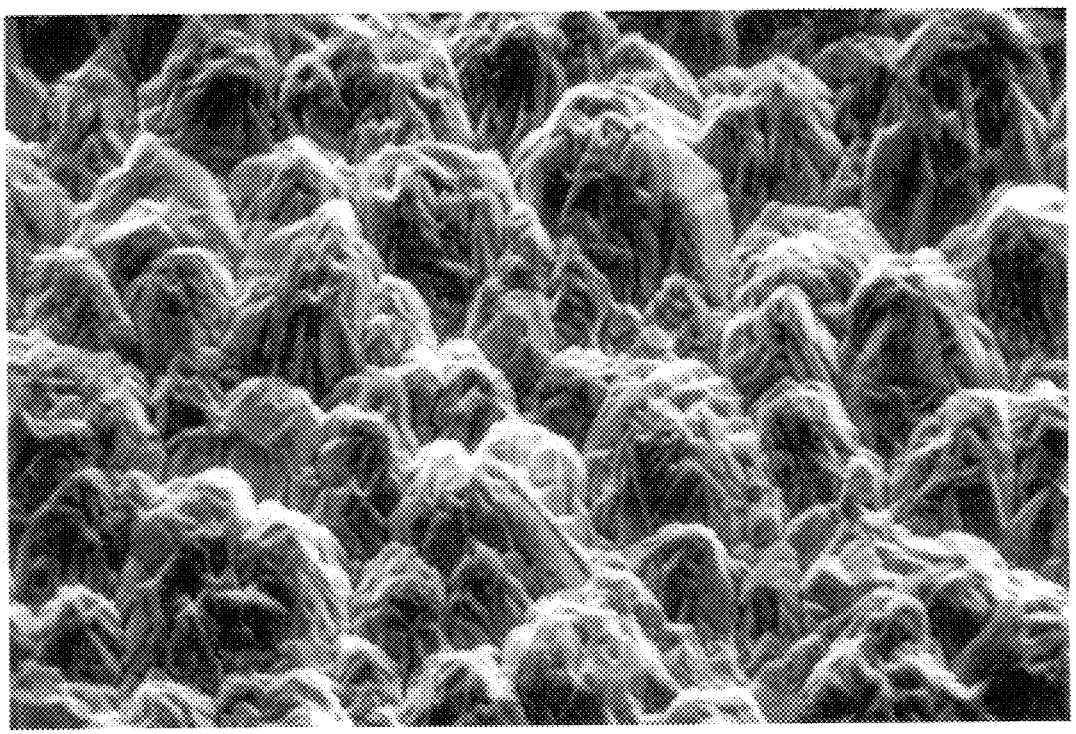
Figure 5C:
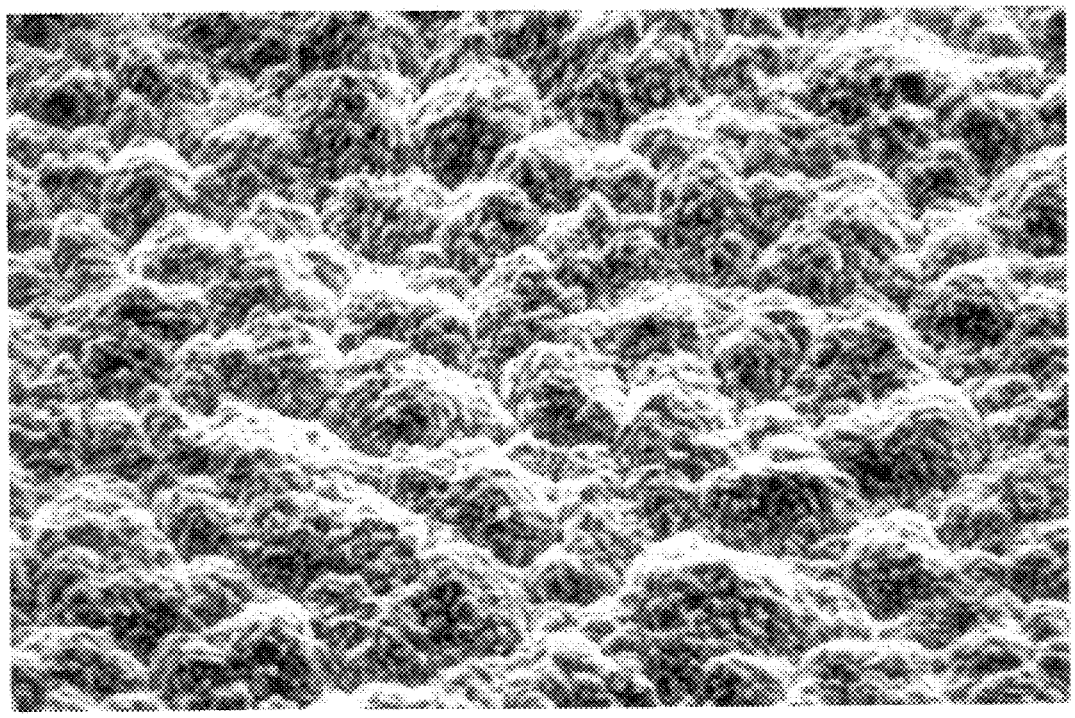

FIG. 4A shows the matte surface of Sample 1, and FIG. 5A shows the matte surface of Sample 1A. FIG. 4B shows the matte surface of Sample 2, and FIG. 5B shows the matte surface of Sample 2A. FIG. 4C shows the matte surface of Sample 3, and FIG. 5C shows the matte surface of Sample 3A.

As can be seen from the photographs, the surfaces of the corrective layers were substantially uniform.

The above results were achieved by using a unique electrolyte in the process, and adjusting the plating parameters (current density and time) according to the Rz of the matte side of the "raw" foil being treated.

Both sides of the treated foil were then stainproofed according to the method disclosed in U.S. Pat. No. 5,447,619. //

DESCRIPTION OF PREFERRED EMBODIMENTS

FIG. 1 illustrates a preferred embodiment of a treated foil in accordance with the present invention, wherein a copper base foil 10 has been electrodeposited on a rotating drum cathode using a well-known method which need not be described in detail herein. The base foil 10 has a shiny drum side 12 and an electrolyte side (matte side) 14 having a matte surface formed micro-peaks 18 and micro-valleys 20 and having a surface roughness (Rz), typically of from about 3 to 8 microns. A bond-enhancing copper layer 16, preferably a plurality of copper layers (dendritic layer followed by encapsulating layer) is electrodeposited on the shiny side 12, using a well-known method, as disclosed, for example, in U.S. Pat. Nos. 5,437,914, 5,447,619, and 5,779,870. On the matte side 14 there is an electrodeposited bonding-enhancing corrective layer 22 formed of micro-spherical shapes of copper and having a surface roughness (Rz) different from that of the base foil, and preferably, about 3–5 microns, and a peak count (average number of micro-peaks per unit of area) greater than that of the base foil. The corrective layer is deposited on the matte side in a treater tank using an electrolyte and plating conditions described hereinbelow. //

Our process of "correcting" the surface characteristics of the matte side of raw foils relies on the confluence of two quantities native to electrodeposition, namely, Micro-throwing power Relationship between the microstructure of an electrodeposit and the intensity of inhibition and the mass transport (y/ydl).

Since the matte side of the foil is composed of densely packed micro-conical or micro-pyramidal shapes, which form a microtopography of peaks and valleys, plating over the matte side represents the case of plating over a micro-profile.

The depth of the profile of raw foil useful in the present invention advantageously varies from 8 to 3 microns. Normal electrodeposition accentuates roughness by putting more deposit on the peaks than in the valleys of a plated surface since the current density is highest at the peaks because of the electric field strength is the greatest in this region. In order to produce a more smooth and shiny surface, more metal has to be deposited in the valleys than on the peaks, which is the opposite of the normal effect. The function of certain organic compounds used as addition agents in the electrolyte is to serve as leveling agents which are adsorbed preferentially on the peaks of the substrate and inhibit deposition. This inhibiting power is destroyed on the surface by a chemical reaction which releases it, setting up a concentration gradient close to the surface. As a result, a so-called micro-throwing power of the plating electrolyte can be changed, which in turn provides the ability to deliberately change the micro-structure and the properties of the deposit. Addition agents (inhibitors) can greatly influence the distribution of the "correction" layer over the micro-profile of the matte side of the foil, as well as the structure (grain size and grain shape) of this layer.

The mechanisms by which these effects are achieved are not completely understood, however it is generally agreed that the additive must be adsorbed in order to exert its effect and thus appears related to its role in the diffusion layer. This "diffusional" theory of leveling and the concept of selective adsorption on active sites or random adsorption to suppress crystallographic differences in the deposit are all important to achieving the benefits of this invention. We have found, also, that different addition agents can act synergistically.

Over micro-profiles the boundary of the diffusion layer does not follow the profile contour, but lies farther from the depths of the micro-recesses than from the micropeaks. The effective thickness, $\delta N$, of the diffusion layer shows still greater variations. This variation of $\delta N$ over a micro-profile therefore produces a variation in the amount of concentration polarization locally. Since the potential is virtually uniform, differences in the local rate of metal deposition result if it is controlled by the diffusion rate either of the depositing ions or of inhibiting addition (leveling) agents.

If the concentration of the leveling agent is such that the rate of its adsorption and consumption at the micropeaks is approximately equal to the rate at which it can be supplied by diffusion, then the concentration gradient has almost the same value at the peaks and the recesses. But because $\delta N$ is larger in the recesses, the rate of diffusion of the leveling agent to recesses is smaller than to the peaks. Accordingly, the extent of surface coverage by the leveling inhibitor is much smaller in recesses. Since the cathode potential is substantially identical on peaks and recesses, polarization is smaller so that the current density and therefore the rate of metal deposition is larger in the recesses than on the peaks, producing true leveling. Thus the variation in surface coverage by inhibitor changes the local activation polarization for metal deposition.

Because the concentration of the depositing metal ion in the electrolyte is high, whereas that of the leveling agent is low, the concentration of leveling agent may become very low at the surface in recesses while that of the depositing metal ion is still large. If the leveling inhibitor concentration in the bath is so high that this substance arrives at the surface in the recess almost as rapidly as at the peaks in spite of the difference in $\delta N$ then the differential inhibition needed to produce leveling is lacking. At lower concentrations of inhibitor, the excess of surface coverage by inhibitor on the peaks over that in the valleys can be considerably greater, so that leveling results. Accordingly, maximum leveling is obtained at a definite concentration of leveling agent, depending on the current density and the surface microgeometry.

Figure 2A:
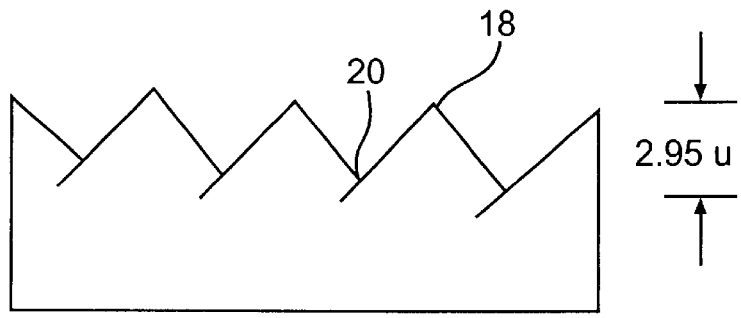
FIGS. 2A–2C illustrate sid views of three conventional upper base foils having differing matte side microtopographies.
Figure 2B:
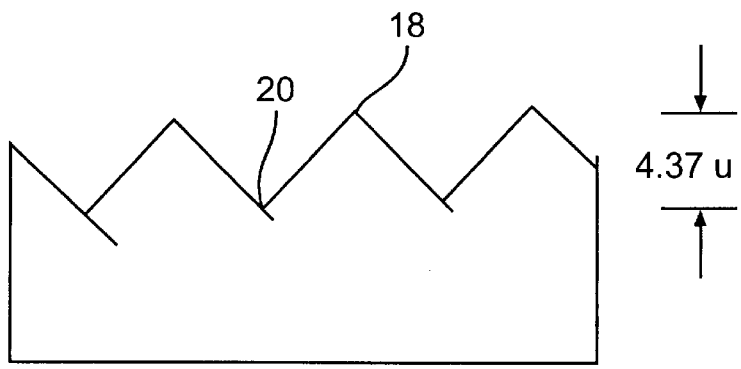
Figure 3A:
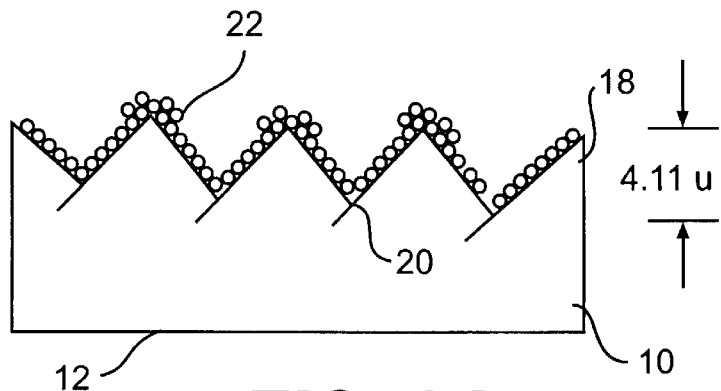
FIGS. 3A–3C illustrate side view of the above foils treated in accordance with the present invention.
Figure 3B:
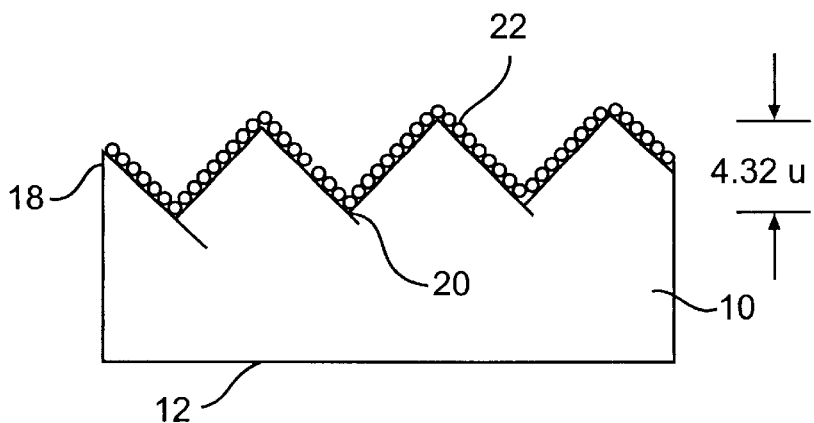

An essential feature of our invention is establishing a relationship of the micro-throwing power of the process and the depth of the profile (Rz) of the matte side of the foil, for example:

If the Rz exceeds 5 microns (See FIG. 2C), the difference between the adsorption of the inhibitors on the peaks, as opposed to the valleys, is sufficiently large to inhibit the deposition of copper on the peaks. The electrodeposition of the "correcting" layer of the present invention is directed toward the valleys and thus a true leveling effect (negative micro-throw) takes place, resulting in lowering of the Rz of the matte side's micro-profile (See FIG. 3C);

If the Rz of the matte side of the raw foil is of the order of 4 microns (See FIG. 2B), the diffusion of inhibitors toward the micro-profile of the matte side varies less over the peaks and the valleys, and a neutral micro-throwing power is established, resulting in a change of the Rz of the matte side (See FIG. 3B); and If the initial Rz of the matte side of the foil is less than about 3 microns (See FIG. 2A), the adsorption of the inhibitors over the peaks and the valleys is virtually identical, and as a result, more copper is plated over the peaks (See FIG. 3A). Since the process reverts to positive micro-throw, the Rz is actually increased.

Thus, the present process of "correction" of the micro-roughness matte side of the foil may lead toward averaging of the Rz, depending on the initial micro-roughness of the base foil. Foils characterized by excessive micro-roughness of the matte side become less rough as a result of our process, while foils with very low micro-profile, become rougher.

In all cases, the present "correction" electrodeposit adds to the "peak count" of the matte side, since the conditions of the process, and particularly the choice of addition agents favor the electrodeposition of the copper corrective layer whose structure is characterized by and composed of microspherical shapes, about 1 micron in diameter.

This is an important feature of our invention, since such structure encourages good and dependable adhesion of photo-resist, and uniform and dependable reflectivity of the matte side of the foil.

Without the addition agents, the copper plating electrolyte would just increase the Rz of the matte side of the foil, without adding to it's "complexity".

When only HEC (hydoxyethyl cellulose) is present in the electrolyte as an addition agent, this decreases the Rz by virtue of leveling, but renders the surface smoother, more reflective and less adherent.

When only PAE (poly(propylene glycol-b-ethylene glycol-b-propylene glycol)bis(2-aminopropyl ether)) is present in the electrolyte as an addition agent, this propagates deposits that increase the initial Rz of the matte side, so that micro-profile of the matte side becomes more prominent in all cases.

Surprisingly, we have discovered that the combination of HEC and PAE, when used as addition agents in the electrolyte accomplishes the objectives of the invention.

While in our experimentation leading to the present invention it has been found that the use of HEC and PAE as addition agents is particularly effective, it shall be understood, in the spirit of invention, it may be found desirable to replace HEC with other, water soluble, cellulose derivatives e.g. carboxy-methylcellulose, and for PAE to be replaced by other monioric, water soluble polymers belonging to the class of polyoxides, polyethers, and polyethylene imidine.

HEC is available commercially in a number of specific grades that differ principally in a molecular weight (MW) as indicated by determination of viscosity of diluted water solutions. Any water soluble grade may be used, but a low viscosity grade, preferably "09" has been found to be a preferred grade.

PAE is commercially available in a MW range of from 600 to 2000. Any of various grades may be used, but MW 2000 is preferred.

Copper foil with the matte side overplated with such corrective layer is an improved raw material for the manufacture of MLB's, and copper clad laminates produced with such foil are superior to the laminates clad with copper foil with a bonding treatment applied to the shiny side of the foil, as proposed by prior art.

The present process of correction of the matte sides of raw foil, with the aim of equalization of the micro-profiles (Rz) of the matte sides which, originally, are different is further aided by the choice of the plating parameters in the "corrective" station of the treater machine.

Figure 2C:
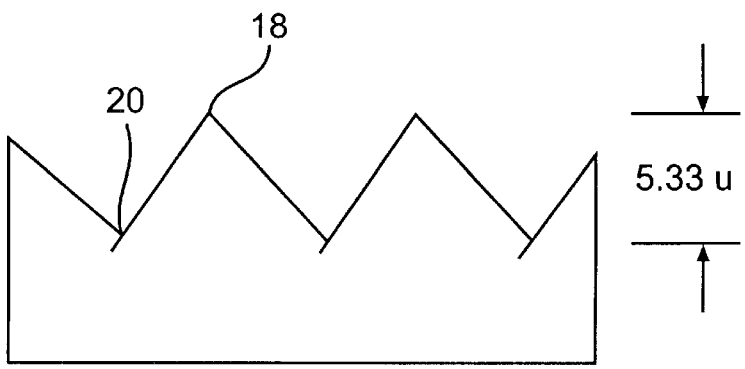
Figure 3C:
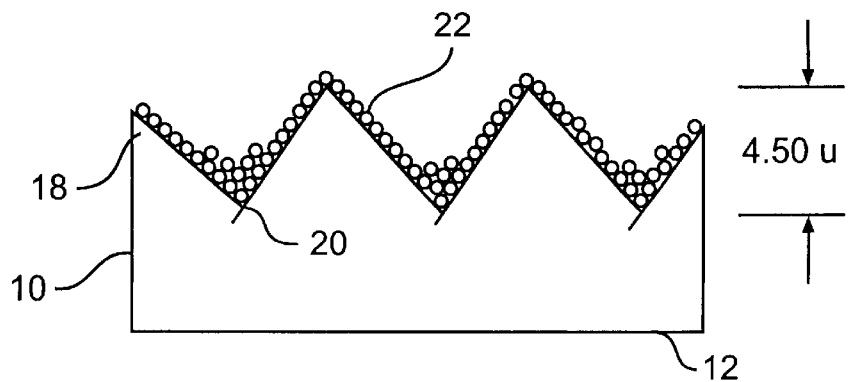

It will be appreciated that raw foils characterized by a relatively coarse micro-topography of the matte side, as shown in FIG. 2C, require the deposition of a greater mass of copper in the corrective layer, while the finer-scale microtopography, as shown in FIG. 2A, require the deposition of a smaller mass of copper in the corrective layer.

To accommodate this requirement, the plating time for the deposition of the present corrective layer is longer in the case of a matte side with a high Rz than the plating time for a matte side with a lower Rz.

As a practical matter, the plating time may be varied by changing the speed of the treater, i.e., the speed at which the base foil is passed through the electrolyte in the treater tanks used in depositing the corrective layer.

Furthermore, the current density used in depositing the corrective layer may also be varied. The current density is higher in the case of the matte side with lower Rz, since this encourages a negative microthrow, which directs most of the corrective layer toward the peaks of the micro-profile.

Current density is lower in the case of a matte side with a higher Rz, since this aids in establishing positive microthrow with its leveling effect.

The construction and operation of treater machines for depositing the bondenhancing copper treatment on the shiny side of the base foil also are well known and need not be described herein in detail, as are the construction and operation of treater machines useful in depositing the present corrective layer of copper on the matte side of the base foil. However, preferred electrolyte and plating conditions useful for depositing the corrective layer are set forth in the following tables.

| ELECTROLYTE: COPPER SULFATE/SULFURIC ACID | | | | |
|---|---|---|---|---|
| | Most Preferred | | | Preferred |
| Case No. | Sample 1 | Sample 2 | Sample 3 | Range |
| Cu (as metal) | 70 g/l | 70 g/l | 70 g/l | 60–110 g/l |
| H$_2$SO$_4$ | 70 g/l | 70 g/l | 70 g/l | 60–150 g/l |
| Chloride | 20 ppm | 20 ppm | 20 ppm | 5–40 ppm |

-continued

ELECTROLYTE: COPPER SULFATE/SULFURIC ACID

|  | Most Preferred | | | Preferred |
|---|---|---|---|---|
| Case No. | Sample 1 | Sample 2 | Sample 3 | Range |
| PAE[a] | 7.5 ppm | 7.5 ppm | 7.5 ppm | 5–15 ppm |
| HEC[b] | 15 ppm | 15 ppm | 15 ppm | 10–20 ppm |

PLATING CONDITIONS

|  | Most Preferred | | | Preferred |
|---|---|---|---|---|
| Case No. | Sample 1 | Sample 2 | Sample 3 | Range |
| Temperature | 102° F. | 120° F. | 120° F. | 90–160° F. |
| Current Density | 200 A/ft$^2$ | 170 A/ft$^2$ | 150 A/ft$^2$ | 100–250 A/ft$^2$ |
| Plating Time | 4 sec. | 6 sec. | 10 sec. | 3–10 sec. |
| Copper Deposition | 0.26 g/ft$^2$ | 0.34 g/ft$^2$ | 0.49 g/ft$^2$ | 0.1–0.83 g/ft$^2$ |

Notes:
[a]Poly(propylene glycol-b-ethylene glycol-b-propylene glycol) bis(2-aminopropyl ether)
[b]Hydroxyethyl Cellulose The present foil, its manufacture, and benefits achieved by the present invention may be seen from the following Example.

EXAMPLE

Three different webs of "base" (or "raw") foil (Samples 1, 2 and 3), each 35 microns thick (so-called one ounce foil in terms of weight per surface area) were produced by means of electrodeposition on a rotating drum-cathode, using the electrolyte, grain refining agents and plating parameters described in U.S. Pat. No. 5,215,646 to Wolski, et al. Only primary anodes were used; a secondary anode was not used.

These "base" foils had one top surface (on the drum side) which was smooth (or shiny), and the other top surface (on the electrolyte side) which was "matte" because of its complex micro-topography composed of micro-peaks and micro-valleys which together formed the matte side's micro-roughness. This micro-roughness was characterized by differing Rz is of 2.95μ, 4.37μ and 5.33μ, respectively, of samples 1, 2 and 3.

The base foils described above were, in turn, each passed through a treater machine in order to provide the shiny side of the foil with a plural layer copper bonding treatment (dendritic layer followed by an encapsulating layer), and at the same time to provide the matte side of the foil with the present copper layer which "corrects" the micro-topography of the matte side. This plural layer bonding treatment applied to the shiny side of the foil employed the techniques, plating parameters, and the electrolytes described in U.S. Pat. No. 4,572,768 to Wolski et al.

The first tank of the treater machine was dedicated to render more uniform the micro-topography of the matte side of each of the base foils by plating onto each a layer of fine scale micro-rough copper, using the most preferred electrolyte shown in the table above and using the most preferred plating conditions shown in the table above.

After the corrective copper layer was deposited on the matte side of each of the three foils, the resulting matte side surfaces of the three webs of copper were examined, both by measuring the Rz and under magnification, and found to be almost identical in terms of Rz (microroughness), despite the fact that these surfaces were before application of the present corrective layer very different, as shown in the following table wherein there is shown the surface characteristics of the matte sides of each of raw foil Samples 1, 2, and 3, and the surfaces of the resulting treated foils, samples 1A, 2A and 3A.

FIG. 4A shows the matte surface of Sample 1, and FIG. 5A shows the matte surface of Sample 1A. FIG. 4B shows the matte surface of Sample 2, and FIG. 5B shows the matte surface of Sample 2A. FIG. 4C shows the matte surface of Sample 3, and FIG. 5C shows the matte surface of Sample 3A.

As can be seen from the photographs, the surfaces of the corrective layers were substantially uniform.

The above results were achieved by using a unique electrolyte in the process, and adjusting the plating parameters (current density and time) according to the Rz of the matte side of the "raw" foil being treated.

Both sides of the treated foil were then stainproofed according to the method disclosed in U.S. Pat. No. 5,447,619.

SURFACE CHARACTERISTICS OF MATTE SIDE

|  | SAMPLE | | SAMPLE | | SAMPLE | | AVG. | AVG. |
|---|---|---|---|---|---|---|---|---|
|  | 1 | 1A | 2 | 2A | 3 | 3A | 1–3 | 1A–3A |
| Grain Size (μ) | 5 | 1–2 | 10 | 1–2 | 10–15 | 1–2 | 10 | 1–2 |
| Peak–Peak Distance (μ) | 5 | 1–2 | 10 | 1–2 | 10–15 | 1–2 | 10 | 1–2 |
| Rz (μ) | 2.95 | 4.11 | 4.37 | 4.32 | 5.33 | 4.50 | 4.22 | 4.31 |
| $R_z/R_{z,avg.}$ | 70% | 95% | 104% | 100% | 126% | 104% | ±30% | ±5% |
| $R_{max}$ (μ) | 3.20 | 4.50 | 4.83 | 4.72 | 6.10 | 4.83 | 4.71 | 4.68 |
| $R_{max}/R_{max,avg.}$ | 68% | 96% | 103% | 101% | 130% | 103% | ±32% | ±4% |
| Peak Counts/in$^2$ | 2 × 10$^7$ | 6 × 10$^8$ | 7 × 10$^6$ | 6 × 10$^8$ | 5 × 10$^6$ | 6 × 10$^8$ | 1 × 10$^7$ | 6 × 10$^8$ |

Copper foil, the matte side of which is overplated with the present corrective layer, offers a further advantage over matte side "as is" as a material for the fabrication of copper clad laminates destined for the use in MLB's.

The prior art has recognized that the brown oxide treatment whose function is to enhance bondability of the top surface of the circuitry's track lines in B stage termination, offers higher peel-strength if it is applied to the matte side of the foil compared with the same brown oxide treatment applied to the shiny side of the foil, as in traditional copper clad laminates. This is an argument in favor of so-called reverse treated foils. U.S. Pat. No. 5,447,619 to Wolski et al., and U.S. Pat. No. 5,779,870 tp Seip state that copper foil produced according to those patents is even better, and offers higher peel-strength, and typically, brown oxide treatment applied to the matte side of one ounce foil offers a peel-strength of 6 up to 7 lbs/inch.

Surprisingly, however, we have found that the same brown oxide treatment applied to the matte side that has been overplated with the corrective layer of the present invention offers a peel-strength of 7 to 8 lbs/inch, a gain of 1 lbs/in.

We believe that this is because the matte side of the foil, overplated with the present corrective layer has a surface area that is larger than the surface area of the matte side of the same foil without the corrective layer.

The present invention provides an increased number of minute surface protrusions (prominences), on the micro-profile of the present corrective layer, which offer the brown-oxide millions of nucleation and anchoring sites, while the matte side of a foil without such corrective layer offers much fewer of such sites. Consequently, not only a higher peel-strength is achieved by the present invention, but also the brownoxide layer is more compact and its individual particles are much less likely to fracture.

Having described preferred embodiments of the present invention, variations and modifications thereof falling within the spirit of the invention may become apparent to those skilled in the art, and the scope of the invention is to be determined by the appended claims and their equivalents.

What is claimed is:

1. A process for producing a treated copper foil, which comprises:

(a) providing a base copper foil made by electrodepositing a copper foil on a rotating drum cathode to produce a first copper base foil having a shiny drum side and an electrolyte side with a matte surface having a first surface roughness; and (b) electrodepositing on the electrolyte side of the base foil a copper micro-rough layer under electrodeposition conditions effective to electrodeposit a first copper micro-rough layer having a surface roughness which is different from the roughness of matte surface and which has a peak count greater than a peak count of the matte surface;

wherein the electrodeposition conditions include the use of a copper sulfate/sulfuric acid electrolyte containing a minor amount of each of poly(propyleneglycol-b-ethylene glycol-b-propylene glycol)bis(2-aminopropyl ether) and hydroxyethyl cellulose.

2. The process of claim 1 further including:

(c) electrodepositing a bond-enhancing copper layer on the shiny drum side of the base foil.

3. The process of claim 1, wherein the electrodeposition conditions include an-electrolyte temperature of from about 90–160° F., a current density of about 100–250 amperes per square foot, a plating time of about 3–10 seconds and a copper deposition rate of about 0.1–0.83 grams per square foot.

4. The process of claim 1, wherein the electrolyte contains about 5–15 ppm poly(propylene glycol-b-ethylene glycol-b-propylene glycol)bis(2-aminopropyl and about 10–20 ppm hydroxyethyl cellulose.

5. The process of claim 4, wherein the electrolyte further contains about 60–100 grams per liter Cu (as metal), about 60–150 grams per liter $H_2SO_4$, and about 5–40 ppm chloride ions.

6. The process of claim 1 further including providing at least a second copper base foil having a matte surface having a second surface roughness different from the first surface roughness of the first base foil; and electrodepositing on the matte surface of the second base foil a second copper micro-rough layer having a surface roughness substantially the same as that of the first copper micro-rough layer.

* * * * *